United States Patent [19]

Terakado

[11] Patent Number: 5,398,255
[45] Date of Patent: Mar. 14, 1995

[54] SEMICONDUCTOR LASER HAVING BURIED STRUCTURE ON P-INP SUBSTRATE

[75] Inventor: Tomoji Terakado, Tokyo, Japan
[73] Assignee: NEC Corporation, Tokyo, Japan
[21] Appl. No.: 251,215
[22] Filed: May 31, 1994

[30] Foreign Application Priority Data

May 28, 1993 [JP] Japan .................. 5-127221

[51] Int. Cl.$^6$ .............................................. H01S 3/19
[52] U.S. Cl. ................................... 372/46; 372/45
[58] Field of Search .......................... 372/46, 50, 45

[56] References Cited

U.S. PATENT DOCUMENTS 5,325,385 6/1994 Kasukawa et al. ................. 372/46

OTHER PUBLICATIONS

S. Yamashita et al, "Low Threshold (3.2 mA per Element) 1.3 μm InGaAsP MQW Laser Array on a p-Type Substrate", *IEEE Photonics Technology Letters*, vol. 4, No. 9, Sep. 1992, pp. 954–957.
Oka et al, "Low-threshold 1.3 μm MQW laser array for optical interconnections", *Technical Report of IEICE*, OQE92-168, 1993-02, pp. 13–18 (no month).
Y. Ohkura et al, "Low Threshold FS-BH Laser on p-InP Substrate Grown by All-Mocvd", *Electronics Letters*, Sep. 1992, vol. 28, No. 19, pp. 1844–1845.

Primary Examiner—James W. Davie
Attorney, Agent, or Firm—Sughrue, Mion, Zinn, Macpeak & Seas

[57] ABSTRACT

A semiconductor laser having a mesa stripe structure with two sides thereof buried by layers comprises a p-InP buried layer, a p-InP current blocking layer, an InGaAsP current blocking layer, and an n-InP current blocking layer. The n-InP current blocking layer is electrically independent by being isolated by the p-InP current blocking layer and the p-InP buried layer which are in touch with each other at the two sides of the mesa stripe structure. With this arrangement, the leakage current is reduced enabling to improve temperature characteristics even at a temperature above 85 degrees.

5 Claims, 2 Drawing Sheets

SEMICONDUCTOR LASER HAVING BURIED STRUCTURE ON P-INP SUBSTRATE

BACKGROUND OF THE INVENTION

1. Field of the Invention

The present invention relates to a semiconductor laser, and more particularly to a semiconductor laser having a buried structure on a p-InP semiconductor substrate.

2. Description of the Related Art

With advancement of optical communication technologies, the fields to which such technologies are applied are rapidly expanding from the trunk transmission system to systems such as subscribers' system, a Local Area Network (LAN), and data links. Since such semiconductor lasers are used in a variety of environments and in a large quantity, they are required to satisfy a high environmental standard and yet they need be low in price. Thus, extensive researches are being made in this direction. A research which deserves attention relates to a semiconductor laser array formed on a p-InP substrate, which enables independent driving as in an optical interconnection light source used in computers, exchange machines, etc. (reported, for example, under the title "Low-threshold 1.3 μm MQW laser array for optical interconnections" by Oka et al. in Technical Report of IEICE, OQE92-168, pages 13–18, (1993-02)). In such array, 10 to 12 semiconductor lasers are normally integrated so that it is important for the characteristics of such lasers to be uniform. In order to enhance the uniformity of the characteristics, it is necessary for a method to be available enabling fabrication of elements which excel in controllability and in uniformity of wafer surfaces. Thus, it has been hoped that a laser be realized by using a metal-organic vapor phase epitaxy (MOVPE) method which provides excellent characteristics as to controllability and uniformity.

Under such circumstances, all-MOCVD grown lasers on p-InP substrate have recently been reported under the title "LOW THRESHOLD FS-BH LASER ON p-InP SUBSTRATE GROWN BY ALL-MOCVD" by Y. Ohkura et al, in Electronics Letters, September 1992 Vol. 28, No. 19, pages 1844–1845.

However, in the buried structure in the semiconductor laser reported by Y. Ohkura et al, the current constriction structure takes a pnpn thyristor configuration called PBH (planar buried heterostructure) so that, although at room temperature of 30° C., a low oscillation threshold current of 12 mA is obtained, a problem occurs at a high temperature of, for example, 85° C. in that the oscillation threshold value abruptly rises due to an increase in the leakage current along with a decrease in the current blocking effects caused by the turn-on operation of the thyristor.

SUMMARY OF THE INVENTION

An object of the present invention, therefore, is to provide a semiconductor laser which overcomes the problems in the prior art and to provide an improved semiconductor laser fabricated on a p-InP substrate, which has a wide application including that to a semiconductor laser array for such use as optical parallel transmission, which exhibits excellent temperature characteristics in oscillation threshold currents, and which is capable of making low driving current operation under a temperature as high as or higher than 85° C.

According to one aspect of the invention, there is provided a semiconductor laser which has a buried structure provided on a p-InP semiconductor substrate and which comprises a mesa stripe structure having an active layer of one of InGaAsP bulk and quantum well structures, a p-InP cladding layer, and an n-InP cladding layer, the active layer being sandwiched between the p-InP and n-InP cladding layers, the mesa stripe structure being entirely buried by an n-InP buried layer and having two sides buried at least by layers comprising:

a p-InP buried layer;

a p-InP current blocking layer in touch with the p-InP buried layer at the two sides of the mesa stripe structure;

an InGaAsP current blocking layer disposed on the p-InP current blocking layer; and an n-InP current blocking layer electrically independent by being isolated by the p-InP buried layer and the p-InP current blocking layer in touch with each other.

In the semiconductor laser according to the invention, the current constriction structure is improved and the leakage current is reduced, and this enables to improve the temperature characteristics in the oscillation threshold currents.

In the prior art semiconductor laser wherein the elements lack an InGaAsP current blocking layer unlike in the semiconductor laser according to the invention, as already pointed out, since the current blocking structure has an InP pnpn thyristor configuration, the leakage current abruptly increases due to the turn-on operation of the thyristor at a high temperature. According to the invention, since the InGaAsP current blocking layer has been introduced, the life time of holes injected to the gate of the thyristor can be made shorter by causing them to be luminously recoupled at the InGaAsP layer, whereby the turn-on operation of the thyristor can be effectively suppressed. Therefore, even at a high temperature, the leakage current is suppressed resulting in the improvement in the temperature characteristics of the oscillation threshold current and in the realization of the semiconductor laser which is capable of making low driving current operation at a temperature as high as or higher than 85° C. This effect is achieved by appropriately selecting the composition of the InCaAsP current blocking layer such that the bandgap energy of the InCaAsP constituting the current blocking layer becomes smaller than the bandgap energy of the InP.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENT OF THE INVENTION

Now, a preferred embodiment of the invention is explained with reference to the accompanying drawings.

Figure 1:
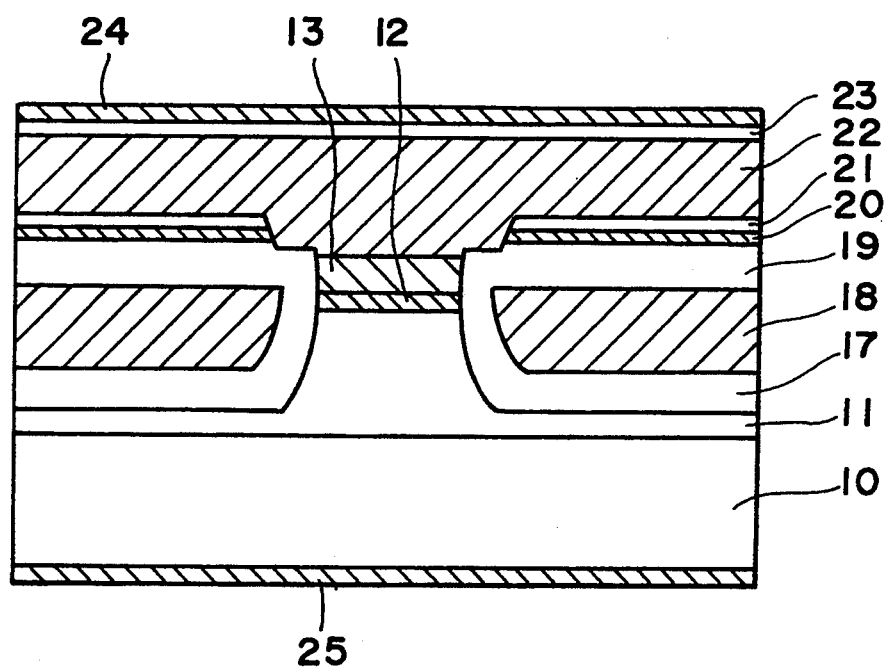
FIG. 1 is a sectional view of a semiconductor laser structure according to the invention.
Figure 3:
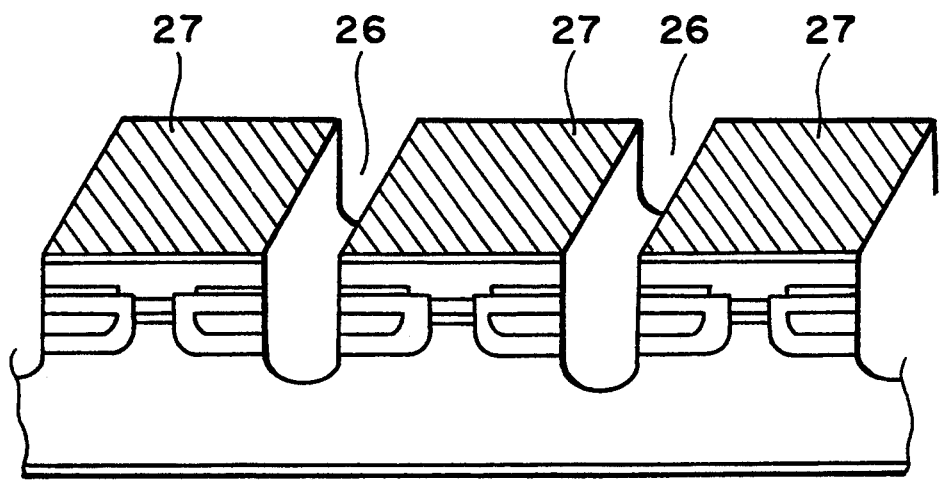
FIG. 3 is a perspective view of a semiconductor laser array structure for explaining the structure according to the invention.

FIG. 1 shows in a diagrammatic sectional view a semi-conductor laser of an embodiment according to the invention. FIGS. 2A–2D show in diagrammatic sectional views the structure shown in FIG. 1, for explaining the principal steps for fabricating the semiconductor laser according to the invention. FIG. 3 shows in a diagrammatic perspective view a part of the laser array wherein a plurality of laser elements are fabricated on the common semiconductor substrate.

Figure 2A:
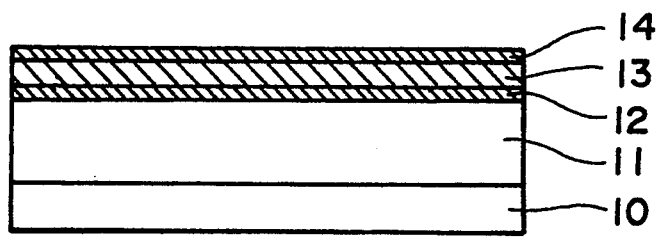
FIGS. 2A, 2B, 2C and 2D are sectional views of the structure for explaining the fabrication steps of the semiconductor laser according to the invention.

First, as shown in FIG. 2A, on a (100) surface of a p-InP semiconductor substrate 10 having a thickness of 350 μm, there are sequentially grown by the MOVPE method a cladding layer 11 of (thickness being 1.5 μm and carrier concentration being $5 \times 10^{17}$ cm$^{-2}$) of p-InP, an active layer 12 (thickness being 0.2 μm and luminous wavelength being 1.3 μm) having a quantum well structure of InGaAsP, a cladding layer 13 (thickness being 0.5 μm and carrier concentration being $1 \times 10^{18}$ cm$^{-2}$) of n-InP, and an etching layer 14 (thickness being 0.1 μm and carrier concentration being $1 \times 10^{18}$ cm$^{-2}$) of n-InGaAs.

Figure 2B:
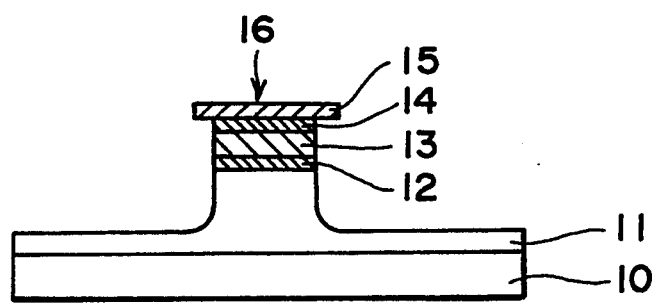

Then, as shown in FIG. 2B, after forming in $<011>$ direction a stripe mask 15 of SiO$_2$ having a thickness of 200 nm and a width of 4 μm by using a CVD and a photolithography process, a mesa 16 having an active layer width of 1.5 μm is formed by etching the respective layers to stop at the p-InP cladding layer 11 using a mixture of bromine (Br) and methylalcohol.

Figure 2C:
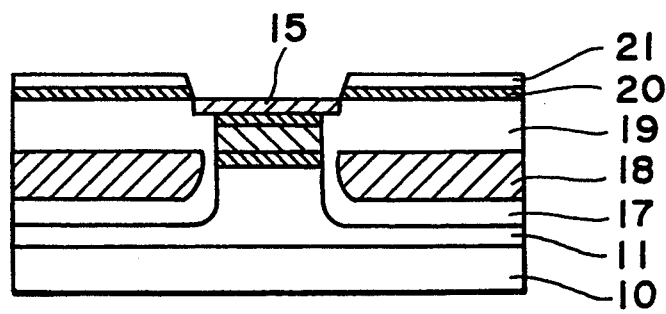

Next, referring to FIG. 2C, by using the stripe mask 15 as a selective growth mask, there are sequentially grown a buried layer 17 (thickness being 0.3 μm and carrier concentration being $5 \times 10^{17}$ cm$^{-2}$) of p-InP, a current blocking layer 18 (thickness being 0.7 μm and carrier concentration being $1 \times 10^{18}$ cm$^{-2}$) of n-InP, a current blocking layer 19 (thickness being 0.5 μm and carrier concentration being $5 \times 10^{17}$ cm$^{-2}$) of p-InP, a current blocking layer 20 (thickness being 0.1 μm) of undoped InGaAsP having a bandgap wavelength of 1.2 μm, and a first buried layer 21 (thickness being 0.2 μm and carrier concentration being $1 \times 10^{18}$ cm$^{-2}$) of n-InP. Here, it should be noted that the p-InP buried layer 17 and the p-InP current blocking layer 19 touch with each other at side surface portions of the mesa stripe 16 and the n-InP current blocking layer 18 is thus caused to be separated from the mesa stripe 16.

Figure 2D:
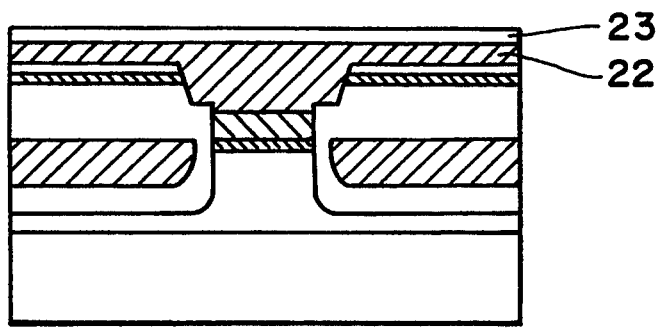

Next, as shown in FIG. 2D, after the removal of the stripe mask 15 by using hydrofluoric acid, a second buried layer 22 (thickness being 1.5 μm and carrier concentration $1 \times 10^{18}$ cm$^{-2}$) of n-InP and a contact layer 23 (thickness being 0.5 μm and carrier concentration being $1 \times 10^{19}$ cm$^{-2}$) of n-InGaAs are sequentially grown.

After an n-electrode 24 of AuGeNi is formed on the contact layer 23, the back surface of the p-InP substrate 10 is ground down until its thickness is reduced to about 100 μm. Then, a p-electrode 25 of AuZn is formed on the back side of the p-InP substrate 10.

Finally, a resonator is formed by cleaving and this completes the semiconductor laser, as shown in FIG. 1, of the embodiment according to the invention.

In the case of a semiconductor laser array, in addition to the above procedure, the elements are positioned with respective intervals of 250 μm and, after the formation of the p-electrode 25, element isolation grooves 26 (width being 10 μm and depth being 3 μm) are formed using an ordinary etching process, and this completes the fabrication of the laser array.

With the element whose two ends are cleaved and which has a cavity length of 300 μm, the characteristics of the semiconductor laser were examined and the results thereof were that, under a temperature of 20° C., the oscillation threshold current of 9 mA and the slope effect of 0.3 W/A were obtained and, under a temperature of 85° C., the oscillation threshold current of 30 mA and the slope effect of 0.25 W/A were obtained.

As above, the invention provides an improved current constriction structure over that in the prior art semiconductor laser by introducing therein tile InGaAsP current blocking layer, whereby the turn-on operation of the pnpn thyristor in the current blocking structure is effectively suppressed. Thus, it is possible to realize a semiconductor laser in which the leakage current is suppressed even at a high temperature and the temperature characteristics of the oscillation threshold current are excellent and which is capable of making low driving current operation even at a temperature above 85° C.

The composition of the InGaAsP current blocking layer is satisfactory if a range is such that the turn-on operation of the thyristor in the blocking structure can be suppressed. In other words, if the InGaAsP mixed crystal has a smaller bandgap energy (i.e., longer wavelength) than InP, that is, if InGaAsP has the luminous wavelength not smaller than 0.92 μm at room temperature, the above advantageous effect can be expected. Also, the same effect can be expected if the InGaAsP current blocking layer employs an InGaAsP multiquantum well structure having the luminous wavelength not smaller than 0.92 μm at room temperature.

In the foregoing, exemplary dimensional parameters have been given for explaining the embodiment of the invention but, since the states of crystal growth and etching widely change depending on, for example, the growth methods and conditions, it is needless to say that appropriate parameters should be adopted in consideration thereof. Kinds of electrode metals or masks in the explained embodiment are not limitative. The active layer is not limitative as long as it is made of InGaAsP or InGaAs and may be in a bulk structure or a quantum well structure.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor laser which has a buried structure provided on a p-InP semiconductor substrate and which comprises a mesa stripe structure having an active layer of one of InCaAsP bulk and quantum well structures, a p-InP cladding layer, and an n-InP cladding layer, said active layer being sandwiched between said p-InP and n-InP cladding layers, said mesa stripe structure being entirely buried by an n-InP buried layer and having two sides buried at least by layers comprising:

a p-InP buried layer;

a p-InP current blocking layer in touch with said p-InP buried layer at said two sides of said mesa stripe structure;

an InGaAsP current blocking layer disposed on said p-InP current blocking layer; and an n-InP current blocking layer electrically independent by being isolated by said p-InP buried layer and said p-InP current blocking layer in touch with each other.

2. The semiconductor laser according to claim 1, in which said InGaAsP current blocking layer is in one of bulk and multi-quantum well structures having luminous wavelengths larger than about 0.92 μm within a range in which an occurrence of lattice mismatch is avoided.

3. A semiconductor laser array in which a plurality of said semiconductor lasers according to claim 1 are provided on a common p-InP semiconductor substrate and in which said plurality of semiconductor lasers are electrically isolated from one another by respective grooves etched at least to the p-InP cladding layer.

4. A semiconductor laser which has a buried structure provided on a p-InP semiconductor substrate and which comprises a mesa stripe structure having an active layer of an InGaAsP bulk structure, a p-InP cladding layer, and an n-InP cladding layer, said active layer being sandwiched between said p-InP and n-InP cladding layers, said mesa stripe structure being entirely buried by an n-InP buried layer and having two sides buried at least by layers comprising:

a p-InP buried layer;

a p-InP current blocking layer in touch with said p-InP buried layer at said two sides of said mesa stripe structure;

an InGaAsP current blocking layer disposed on said p-InP current blocking layer; and an n-InP current blocking layer electrically independent by being isolated by said p-InP buried layer and said p-InP current blocking layer in touch with each other.

5. A semiconductor laser which has a buried structure provided on a p-InP semiconductor substrate and which comprises a mesa stripe structure having an active layer of a quantum well structure, a p-InP cladding layer, and an n-InP cladding layer, said active layer being sandwiched between said p-InP and n-InP cladding layers, said mesa stripe structure being entirely buried by an n-InP buried layer and having two sides buried at least by layers comprising:

a p-InP buried layer;

a p-InP current blocking layer in touch with said p-InP buried layer at said two sides of said mesa stripe structure;

an InCaAsP current blocking layer disposed on said p-InP current blocking layer; and an n-InP current blocking layer electrically independent by being isolated by said p-InP buried layer and said p-InP current blocking layer in touch with each other.

* * * * *

UNITED STATES PATENT AND TRADEMARK OFFICE
CERTIFICATE OF CORRECTION

PATENT NO. : 5,398,255
DATED : March 14, 1995
INVENTOR(S) : Tomoji TERAKADO

It is certified that error appears in the above-indentified patent and that said Letters Patent is hereby corrected as shown below:

Col. 2, line 49, delete "InCaAsP" and insert -- InGaAsP--

Col. 2, line 51, delete "InCaAsP" and insert -- InGaAsP--

Col. 4, line 16, delete "tile" and insert -- the--

Col. 4, line 61, delete "InCaAsP" and insert -- InGaAsP--

Col. 6, line 24, delete "InCaAsP" and insert -- InGaAsP--

Signed and Sealed this

Eighteenth Day of July, 1995

*Attest:*

BRUCE LEHMAN

*Attesting Officer*       *Commissioner of Patents and Trademarks*